(12) United States Patent
Ayalasomayajula et al.

(10) Patent No.: US 12,557,683 B2
(45) Date of Patent: Feb. 17, 2026

(54) SOLDER GRID ARRAY FOR ATTACHMENT OF A DIE PACKAGE

(71) Applicant: Intel Corporation, Santa Clara, CA (US)

(72) Inventors: Mukund Ayalasomayajula, Chandler, AZ (US); Dinesh Padmanabhan Ramalekshmi Thanu, Chandler, AZ (US); Rui Zhang, Chandler, AZ (US); Xiao Lu, Chandler, AZ (US); Robert Nickerson, Chandler, AZ (US); Patrick Neel Stover, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 17/556,444

(22) Filed: Dec. 20, 2021

(65) Prior Publication Data

US 2023/0197659 A1    Jun. 22, 2023

(51) Int. Cl.
*H01L 23/00* (2006.01)

(52) U.S. Cl.
CPC .............. *H01L 24/16* (2013.01); *H01L 24/03* (2013.01); *H01L 24/81* (2013.01); *H01L 2924/01029* (2013.01); *H01L 2924/01047* (2013.01); *H01L 2924/0105* (2013.01); *H01L 2924/1432* (2013.01)

(58) Field of Classification Search
CPC ......... H01L 24/16; H01L 24/03; H01L 24/81; H01L 2924/01029; H01L 2924/01047; H01L 2924/0105; H01L 2924/1432; H01L 24/05; H01L 24/11; H01L 24/13; H01L 23/49811; H01L 21/56; H01L 21/60; H01L 23/3121; H01L 23/49838; H01L 2021/60135
See application file for complete search history.

(56) References Cited

U.S. PATENT DOCUMENTS

| | | | |
|---|---|---|---|
| 6,235,996 B1 * | 5/2001 | Farooq | H01L 23/49811 257/737 |
| 10,964,656 B2 * | 3/2021 | Kwon | H01L 24/11 |
| 2020/0174205 A1 * | 6/2020 | Kubo | H05K 1/181 |

* cited by examiner

*Primary Examiner* — Fernando L Toledo
*Assistant Examiner* — Shawn Shaw Muslim
(74) *Attorney, Agent, or Firm* — Essential Patents Group, LLP

(57) ABSTRACT

A die package comprises a substrate comprising a solder pad element, a semiconductor die coupled to the substrate, a solder layer comprising a first solder material deposited on the solder pad element, the first solder material having a first melting temperature, and an interconnect ball comprising a second solder material deposited on the solder layer, the second solder material having a second melting temperature that is less than the first melting temperature.

24 Claims, 8 Drawing Sheets

SOLDER GRID ARRAY FOR ATTACHMENT OF A DIE PACKAGE

TECHNICAL FIELD

Embodiments described herein generally relate to electrical connections in electronic devices. More specifically, embodiments described herein relate to improved electrical connection between a die package substrate and a circuit board.

BACKGROUND

Electronic devices may include ball grid arrays or other types of solder arrays to connect the substrate of a die package to another substrate, such as a circuit board. The solder bumps that are formed as part of these arrays are often used to electronically test one or more semiconductor dies that are coupled to the substrate. The conditions of the electronic testing can be such that they lead to deformation or damage to the solder bumps.

DESCRIPTION OF EMBODIMENTS

Figure 1:
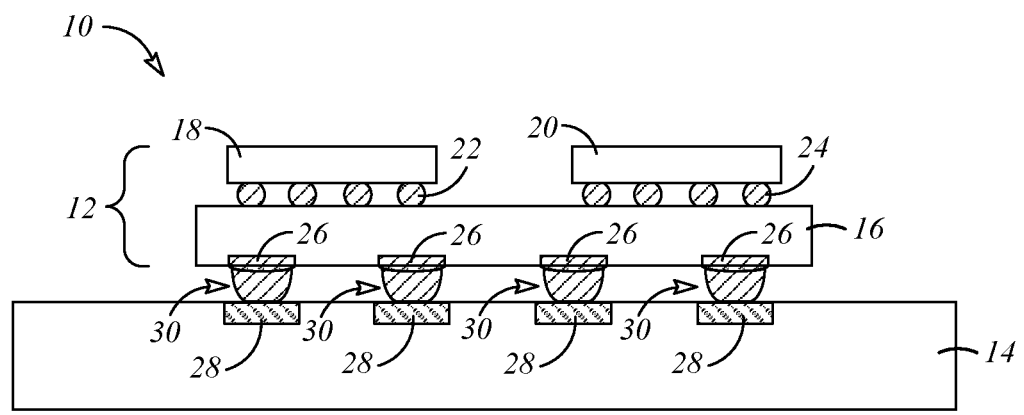
FIG. 1 is a side plan view of an electronic die package coupled to a motherboard, in accordance with some example embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present application, in one or more embodiments, relates to a solder connection in a connection array between an electronic die package and a circuit board, such as a motherboard. Recently, the use of solder materials having a relatively low melting temperature, e.g., a melting temperature of less than 200° C., for example less than 190° C., also referred to hereinafter as "low-temperature solder," has become more prominent because of the reduced chance of warping by the package substrate and/or the semiconductor die or dies at the lower temperature when reflowing the low-temperature solder material to provide for the electrical and mechanical connection between the die package substrate and the circuit board. However, electrical socket testing of the die package can tend to be more likely to result in solder ball deformation or socket burning when the testing is performed on low-temperature solder materials. For example, electrical testing of the die package can require the need to physically probe the die package contacts dozens or even hundreds of times at temperatures of more than 100° C. When low-temperature solder materials are used to form the solder balls, it can result in flattening or "pancaking" of the solder balls, which can eventually lead to solder ball bridging, socket contamination, improper contact between the socket and the solder balls leading to a false electrical open signal, and electrical failure of the die package. The solder ball deformation can also cause socket burning due to unbalanced force application on the solder balls.

It is also not practical to perform the electrical testing using the land solder pads on the die package substrate because the socket testing may result in damage or may otherwise alter the solder pads, making it less likely that a satisfactory joint will form between the solder pad and the solder material that forms the ball joints. In some examples, the latest packaging technologies, like coreless packaging, die package land solder pads comprise copper with a preservative surface finish, such as an organic preservation material, applied to the copper to prevent oxidation of the copper solder pad. However, electrical testing on the preservative-coated copper is not possible because the preservative surface finish layer is electrically non-conductive. Removing the preservative surface finish layer and then performing electrical testing on the copper solder pad is also undesirable, because the conditions of the electrical testing would tend to result in oxidation of the copper. Oxidized copper tends not to wet to the solder material, making joint formation between the solder material and the land solder pads extremely challenging.

FIG. 1 illustrates an electronic device 10 that provides for a solution for these problems via the formation of a hybrid solder joint interface that provides a first structure coupled to the land solder pad on the die package substrate and a second structure for coupling to a corresponding contact pad on circuit board. In an example, the first structure is configured to withstand the harsher conditions of electrical testing, while the second structure is formed from a low-temperature solder material to provide for warpage benefits when forming the final solder joints between the die package substrate and a circuit board. The electronic device 10 includes an electronic die package 12 electrically and mechanically coupled to a circuit board 14, such as a motherboard 14. In an example, the electronic die package 12 comprises a die package substrate 16 (also referred to simply as "the substrate 16") with one or more semiconductor dies 18, 20 coupled to the substrate 16. In the example of FIG. 1, the electronic package 12 comprises two semiconductor dies, a first semiconductor die 18 and a second semiconductor die 20. In an example, the first semiconductor die 18 is coupled to the substrate 16 with a plurality of first solder joints 22 and the second semiconductor die 20 is coupled to the substrate 16 with a plurality of second solder joints 24. In an example, each semiconductor die 18, 20 comprises one of any type of microelectronic device including, but not limited to, integrated circuits (ICs), chips, chip sets, memory devices, processors, such as a central processing unit (CPU), a graphics processing unit (GPU), advanced processing unit (APU), or combinations thereof.

The substrate 14 can also include a plurality of land solder pads 26. In an example, the land solder pads 26 (also referred to hereinafter as "solder pads 26" or simply as "the pads 26") are on an opposite side of the substrate 14 to which the one or more semiconductor dies 18, 20 are connected. For example, as shown in FIG. 1, the one or more dies 18, 20 can be electrically and mechanically coupled to a top side of the substrate 14 and the solder pads 26 are located on a bottom side of the substrate 14 (in the orientation shown in FIG. 1). The solder pads 26 can be electrically connected to the one or more semiconductor dies 18, 20 by one or more internal structures in the substrate 14, such as vias or other known interconnect structures (not shown). A solder joint can be formed onto each of the solder pads 26 for electrically and mechanically connecting each solder pad 26 to a corresponding contact pad 28 on the circuit board 14.

Figure 2:
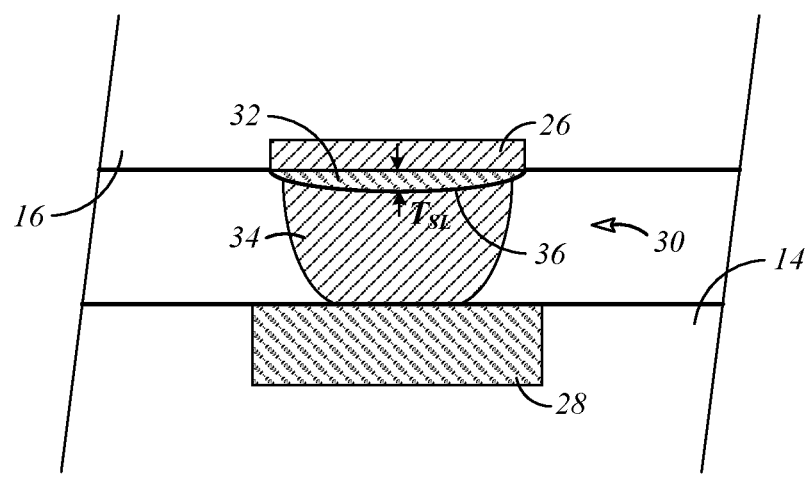
FIG. 2 is a close-up side plan view of a hybrid solder connection between an electronic die package and a motherboard, in accordance with some example embodiments.

In an example, each of the solder joints that are formed between the land solder pad 26 on the substrate 16 and the corresponding contact pad 28 on the circuit board 14 comprises a hybrid solder joint 30. As mentioned above, in an example each solder joint 30 includes a first structure for contacting the solder pad 26, which can be configured to withstand the harsher conditions of electrical testing, and a second structure for contacting and coupling the solder joint 30 to its corresponding contact pad 28 on the circuit board 14, which can be formed from a low-temperature solder material to provide for warpage benefits. FIG. 2 shows a close-up cross-sectional view of an example hybrid solder joint 30 comprising this configuration. In an example, the first structure that is configured to withstand electrical testing is a relatively thin solder layer 32 deposited on the land solder pad 26 of the substrate 16. The electrical testing that can be performed on the one or more semiconductor dies 18, 20 coupled the substrate 16 can be performed by electrically contacting the solder layer 32 with an electrical testing apparatus (discussed in more detail below) before forming the second structure of the hybrid solder joint 30. The relatively thin solder layer 32 deposited on the solder pad 26 is formed from a first solder material that is better able to withstand the conditions of the electrical testing. For example, the first solder material of the solder layer 32 can have a first melting temperature. In an example, the first melting temperature can be relatively high, e.g., so that the when the one or more semiconductor dies 18, 20 are being electrically tested at elevated temperatures (i.e., temperatures higher than 100° C.) the more resilient first solder material is what is exposed to the electrical testing conditions. In an example, the first melting temperature of the first solder material that forms the solder layer 32 is a melting temperature of at least 215° C., for example at least 216° C., at least 217° C., at least 218° C., at least 219° C., at least 220° C., at least 225° C., at least 230° C., at least 235° C., at least 240° C., at least 245° C., or at least 250° C.

In an example, the first solder material of the solder layer 32 can have other properties that make it conducive to electrical testing, such as a hardness above a specified hardness threshold, a modulus above a specified modulus threshold, a tensile strength above a specified tensile strength threshold, an elongation above a specified elongation threshold, and the like. In an example, the first solder material of the solder layer 32 has a Vickers hardness (HV) of at least about 11, for example at least about 12, such as at least about 14, for example from about 11 to about 19, such as from about 11.4 to about 18.3. In an example, the first solder material of the solder layer 32 has a Young's modulus of at least about 35 GPa, for example at least about 45 GPa, such as from about 35 GPa to about 50 GPa. In an example, the first solder material of the solder layer 32 has a tensile strength of at least about 34 MPa, for example at least about 40 MPa, such as at least about 45 MPa, for example from about 30 MPa to about 55 MPa, such as from about 34 MPa to about 53.5 MPa. In an example, the first solder material of the solder layer 32 has an elongation of at least about 40%, for example at least about 50%, such as at least about 55%, for example from about 40% to about 75%, such as from about 45% to about 65%.

Examples of the first solder material that can be used to form the thin solder layer 32 include, but are not limited to, a solder material comprising tin (Sn), silver (Ag), and copper (Cu), also referred to as "SAC solders," for example a solder material comprising from about 0 wt. % to about 5 wt. % silver, for example from about 1 wt. % to about 4 wt. % silver, from about 0.1 wt. % to about 1 wt. % copper, for example about 0.3 wt. % to about 0.5 wt. % copper, and the balance tin (e.g., at least about 90 wt. % tin, for example at least about 91 wt. % tin, such as at least about 92 wt. % tin, for example at least about 92.5 wt. % tin, such as at least about 93 wt. % tin, for example at least about 94 wt. % tin, such as at least about 95 wt. % tin, for example at least about 95.5 wt. % tin, at least about 96 wt. % tin, at least about 96.5 wt. % tin, at least about 97 wt. % tin, at least about 97.5 wt. % tin, at least about 98 wt. % tin, or at least about 98.5 wt. % tin). In a non-limiting example, the first solder material that forms the solder layer 32 comprises a SAC solder material that is 4 wt. % silver, 0.5 wt. % copper, and the balance tin (about 95.5 wt. % tin). Other examples of SAC solders that can be used to form the solder layer 32 include a solder material that is 3 wt. % silver, 0.5 wt. % copper, and the balance tin (about 96.5 wt. % tin); a solder material that is 2 wt. % silver, 0.5 wt. % copper, and the balance tin (about 97.5 wt. % tin); a solder material that is 1.2 wt. % silver, 0.5 wt. % copper, and the balance tin (about 98.3 wt. % tin); or a solder material that is 1 wt. % Ag, 0.5 wt. % copper, and the balance tin (about 98.5 wt. % tin). In an example, the first solder material that forms the solder layer 32 can include small amounts of one or more dopants, e.g., less than about 5 wt. %, including, but not limited to, antimony (Sb), nickel (Ni), zinc (Zn), and bismuth (Bi). Solder materials other than SAC solders that can be used as the first solder material that forms the solder layer 32 include, but are not limited to: tin-lead (SnPb) alloys, such as those containing, for example, from about 5 wt. % to about 70 wt. % tin (Sn) and the balance lead (Pb); or tin-copper (SnCu) alloys, such as those containing, for example, from about 99 wt. % to about 99.5 wt. % tin (Sn) and from about 0.4 wt. % to about 0.8 wt. % copper (Cu), with or without a small amount of dopant such as nickel (Ni), bismuth (Bi), antimony (Sb), or zinc (Zn).

Continuing with FIG. 2, in an example, the second structure of the hybrid solder joint 30, e.g., the structure that is in contact with and forms a joint with the contact pad 28 on the circuit board 14, is an interconnect ball 34 that is deposited on the solder layer 32. In an example, the interconnect ball 34 is formed from a second solder material that is different from the first solder material, wherein the second solder material of the interconnect ball 34 is selected to have certain properties. In an example, the second solder material is selected to have a second melting temperature that is less than the first melting temperature of the first solder material. In an example, the second melting temperature is selected to be below a specified threshold so that when the interconnect ball 34 is melted in order to form an electrical and mechanical joint with the circuit board contact pad 28, warping of one or more of the circuit board 14, the substrate 16, and the one or more semiconductor dies 18, 20 are kept below a specified warpage value. In particular, the specified warpage value may be selected to be sufficiently low so that the die package 12 can be surface mounted to the circuit board 14. In an example, the specified warpage value can be set at about 150 micrometers (μm) or less, for example about 145 μm or less, such as 140 μm or less, for example 135 μm or less, such as 130 μm or less. In an example, a second melting temperature that has been found to provide for warpage below these values, even for relatively large form factors, are temperatures of no more than about 200° C., for example no more than about 190° C., no more than about 185° C., no more than about 180° C., no more than about 175° C., no more than about, 170° C., no more than about 165° C., no more than about 160° C., no more than about 155° C., no more than about 150° C., no more than about 145° C., no more than about 140° C., no more than about 135° C., no more than about, or no more than about 130° C.

In an example, the second solder material of the interconnect ball 34 can have other properties that make it conducive to coupling to the contact pad 28 on the circuit board and to the first solder material of the solder layer 32, such as a melting point that is lower than the melting point of the first solder material.

Examples of the second solder material that can be used to form the interconnect ball 34 include, but are not limited to, a solder material that comprise one or more of tin (Sn), silver (Ag), copper (Cu), and a sizable proportion of one or more dopant elements that reduce the melting temperature of the solder material (also referred to hereinafter as a "melting-temperature reducing dopant" or simply "a dopant"). One or more dopants may also be added to enhance properties of the interconnect ball 34 such as its strength, ductility, and reliability. Examples of dopants include, but are not limited to, bismuth (Bi), antimony (Sb), nickel (Ni), zinc (Zn), indium (In), gallium (Ga), palladium (Pd), and copper (Cu), although other metal dopants can be added to alter the solder properties of the resulting interconnect ball 34. In an example, the second solder material comprises at least about 30 wt. % of the dopant, for example at least about 35 wt. % of the dopant, such as at least about 40 wt. % of the dopant, for example at least about 45 wt. % of the dopant, such as at least about 50 wt. % of the dopant, for example at least about 55 wt. % of the dopant, such as at least about 60 wt. % of the dopant. In an example, the second solder material comprises from about 30 wt. % to about 60 wt. % of the dopant. In a non-limiting example, the second solder material that forms the interconnect ball 34 comprises about 42 wt. % tin (Sn), 58 wt. % bismuth (Bi), and about 1 wt. % silver (Ag). In another example, the second solder material that forms the interconnect ball 34 comprises about 42 wt. % tin (Sn) and about 58 wt. % bismuth (Bi). Other types of solder materials other than those containing tin, silver, copper, and one or more of the above-listed dopant elements that can be used as the second solder material that forms the interconnect ball 34 include, but are not limited to, an indium-tin-silver (InSnAg) alloys, such as one having from about 20 wt. % to about 90 wt. % indium (In), from about 10 wt. % to about 80 wt. % tin (Sn), and from about 0 wt. % to about 3.5 wt. % silver (Ag). Examples of InSnAg alloys include, but are not limited to: an alloy comprising about 52 wt. % indium (In) and about 48 wt. % tin (Sn); an alloy comprising about 20 wt. % indium (In), about 77.2 wt. % tin (Sn), and about 2.8 wt. % silver (Ag); or an alloy comprising about 86.9 wt. % indium (In), about 10 wt. % tin (Sn), and about 3.1 wt. % silver (Ag).

In an example wherein the first melting temperature of the first solder material that forms the solder layer 32 is higher than the second melting temperature of the second solder material that forms the interconnect ball 34, the second solder material can be formed on the solder layer 32 at a temperature that is higher than the second melting temperature (so as to reflow the second solder material in order to form the interconnect ball 34) but that is lower than the first melting temperature (e.g., so that the solder layer 32 does not melt during the reflowing of the second solder material to form the interconnect ball 34). This can allow the second solder material to be formed into the interconnect ball 34 without modifying the shape of the solder layer 32, e.g., so that the solder layer 32 remains solid during melting and reflowing of the second solder material to form the interconnect ball 34. In such a scenario, the hybrid solder joint 30 comprises a distinct borderline 36 between the solder layer 32 and the interconnect ball 34 with little or no intermixing between the first solder material that forms the solder layer 32 and the second solder material that forms the interconnect ball 34. However, this may not be necessary and in some examples, the reflowing of the second solder material to form the solder ball 34 can be performed at a temperature that is higher than the melting temperatures of both the first and second solder materials so that there is some intermixing between the first and second solder materials while still providing for a primarily segregated hybrid solder joint.

In an example, the solder layer 32 can have a thickness $T_{SL}$ that is relatively small so that the solder layer 32 will be relatively flat such that when the interconnect ball 34 is formed it will not tend to roll off the solder layer 32. In an example, the solder layer 32 has a thickness $T_{SL}$ at its thickest point that is 100 μm or less, for example about 75 μm or less, such as 60 μm or less, for example about 55 μm or less, such as about 50 μm or less, for example about 45 μm or less, such as about 40 μm or less, for example about 35 μm or less, such as about 30 μm or less, for example about 25 μm or less, such as about 20 μm or less, for example about 19 μm or less, such as about 18 μm or less, for example about 17 μm or less, such as about 16 μm or less, for example about 15 μm or less, such as about 14 μm or less, for example about 13 μm or less, such as about 12 μm or less, for example about 11 μm or less, such as about 10 μm or less.

Figure 3:
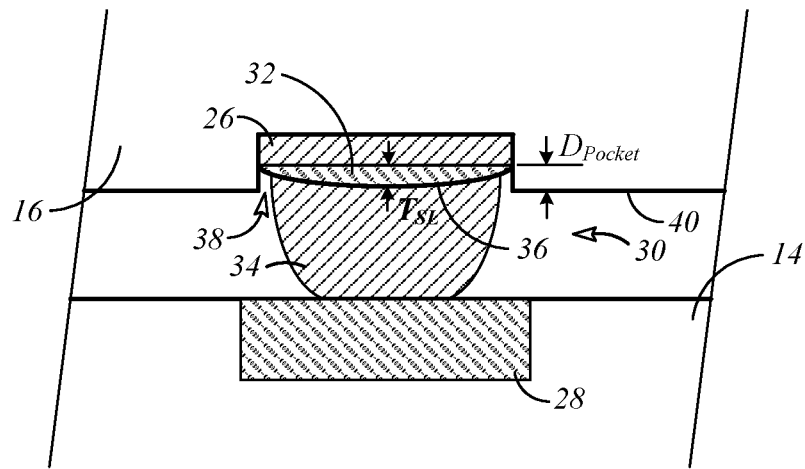
FIG. 3 is a close-up side plan view of a second example hybrid solder connection between an electronic die package and a motherboard, in accordance with some example embodiments.

FIG. 3 shows an example of an alternative substrate 16 wherein the solder pad 26 is located within a solder resist opening 38 in the substrate 16 (also referred to hereinafter as "the substrate pocket 38" or simply "the pocket 38"). The substrate pocket 38 has a depth $D_{Pocket}$ from an outer surface of the solder pad 26 to an outer surface 40 of the substrate 16. In an example, shown in FIG. 3, the thickness $T_{SL}$ of the solder layer 32 is less than or equal to the depth $D_{Pocket}$ of the pocket 38. For example, if the pocket 38 has a depth $D_{Pocket}$ of about 15 μm, then in an example the solder layer 32 can have a thickness $T_{SL}$ at its thickest point that is the same as the pocket depth $D_{Pocket}$, e.g., about 15 μm, or that is less than the pocket depth $D_{Pocket}$, e.g., with the thickness $T_{SL}$ being less than 15 μm. In another non-limiting example, the pocket 38 has a depth $D_{Pocket}$ that is about 12 μm, and the solder layer 32 has a thickness $T_{SL}$ at its thickest point that is 12 μm or less.

Figure 4:
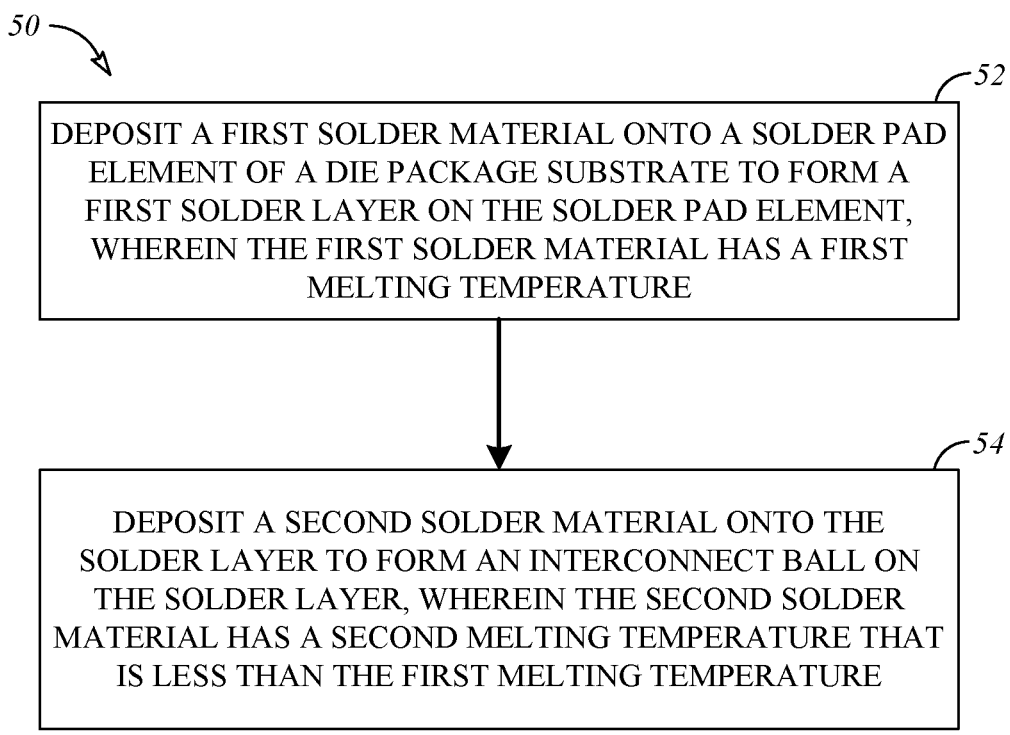
FIG. 4 is a flow diagram of an example method of manufacturing an example hybrid solder connection structure on an electronic die package, in accordance with some example embodiments.

FIG. 4 is a flow diagram of an example method 50 of fabricating a hybrid solder joint, such as the hybrid solder joint 30 shown in FIGS. 1-3. In an example, the method 50 includes, at step 52, depositing a first solder material onto a solder pad element of a die package substrate, such as the example solder pad 26 of the die package substrate 16 as shown in FIGS. 1-3. The step of depositing the first solder material 52 is such that the first solder material forms a solder layer on the solder pad element, such as the example solder layer 32 on the solder pad 26 as shown in FIGS. 2 and 3. The first solder material that forms the solder layer 32 has a first melting temperature. As discussed above, in an example, the first melting temperature of the first solder material is selected so that the solder layer formed from the first solder material can withstand certain conditions, such as being able to withstand electrical testing at a specified temperature. Examples of specific compositions for the first solder material that is deposited in step 52 in order to form the solder layer 32 are discussed above.

As described in more detail below, in an example, depositing the first solder material (step 52) includes depositing a first solder paste onto the solder pad 26, followed by reflowing the first solder paste to leave behind the first solder material in order to form the solder layer 32. As will be appreciated by those having skill in the art, a solder paste can comprise particles of the metals that form the first solder material dispersed in a flux material. In some examples, the particles have the same composition as the desired final first solder material that will form the solder layer 32, e.g., so that the particles already have the desired metallurgical composition of the final first solder material. In other examples, individual particles in the paste may have a composition that is different from the final composition of the first solder material, but the overall composition of the particles is such that when the particles are melted and reflowed together, the resulting solder layer 32 has the desired final composition of the first solder material. For example, when the first solder material is a SAC solder, a first portion of the particles can comprise tin, a second portion of the particles can comprise silver, and a third portion of the particles can comprise copper, wherein the first, second, and third portions are such that when the particles are melted and flowed together, it results in a first solder material having the desired weight percentages of tin, silver, and copper, respectively. In an example, the solder paste that is used to form the first solder material can include a water soluble paste or a no clean paste. In another example, depositing the first solder material (step 52) can include depositing a first solder paste or flux, which is used to assist in the placement of a first solder ball, followed by reflowing the first solder paste or flux and the first solder ball to form the solder layer 32. The combined composition of the first solder paste or flux and the first solder ball are such that when they are reflowed, the resulting solder layer 32 will have the desired composition of the first solder material.

The method 50 also includes, at step 54, depositing a second solder material onto the solder layer in order to form an interconnect ball on the solder layer, such as the interconnect ball 34 on the solder layer 32 as shown in FIGS. 2 and 3. The second solder material that forms the interconnect ball 34 has a second melting temperature that is less than the first melting temperature. As discussed above, in an example, the second melting temperature is selected so that when the interconnect ball 34 is melted and reflowed to form a mechanical and electrical joint between the die package substrate 16 and a circuit board 14, the temperature at which the interconnect ball 34 is melted is relatively low so as to minimize warpage of the substrate 16 during the interconnection. Examples of specific compositions for the second solder material that is deposited in step 54 in order to form the interconnect ball 34 are described above.

Similar to the step 52 of depositing the first solder material, in an example, depositing the second solder material (step 54) includes depositing a second solder paste onto the solder layer 32, followed by reflowing the second solder past to leave behind the second solder material in order to form the interconnect ball 34. As with the first solder paste, in an example, the second solder paste comprises particles of the metals that form the second solder material, wherein the particles are dispersed in a flux material. In some examples, the particles of the second solder paste have the same composition as the desired final second solder material that will form the interconnect ball 34, e.g., so that the particles in the second solder paste already have the desired metallurgical composition of the final second solder material. In other examples, individual particles in the second solder paste may have a composition that is different from the final composition of the second solder material, but the overall composition of the particles is such that when the particles are melted and reflowed together, the resulting interconnect ball 34 has the desired final composition of the second solder material. For example, when the second solder material is a SAC-based solder with a bismuth dopant included, a first portion of the particles can comprise tin, a second portion of the particles can comprise silver, a third portion of the particles can comprise copper, and a fourth portion of the particles can comprise bismuth wherein the first, second, third, and fourth portions are such that when the particles are melted and flowed together, it results in the second solder material having the desired weight percentages of tin, silver, copper, and bismuth, respectively. In an example, the solder paste that is used to form the second solder material can include a water soluble paste or a no clean paste. In another example, depositing the second solder material (step 54) can include depositing a second solder paste or flux, which is used to assist in the placement of a second solder ball, followed by reflowing the second solder paste or flux and the second solder ball to form the interconnect ball 34. The combined composition of the second solder paste or flux and the second solder ball are such that when they are reflowed, the resulting interconnect ball 34 will have the desired composition of the second solder material.

Figure 5:
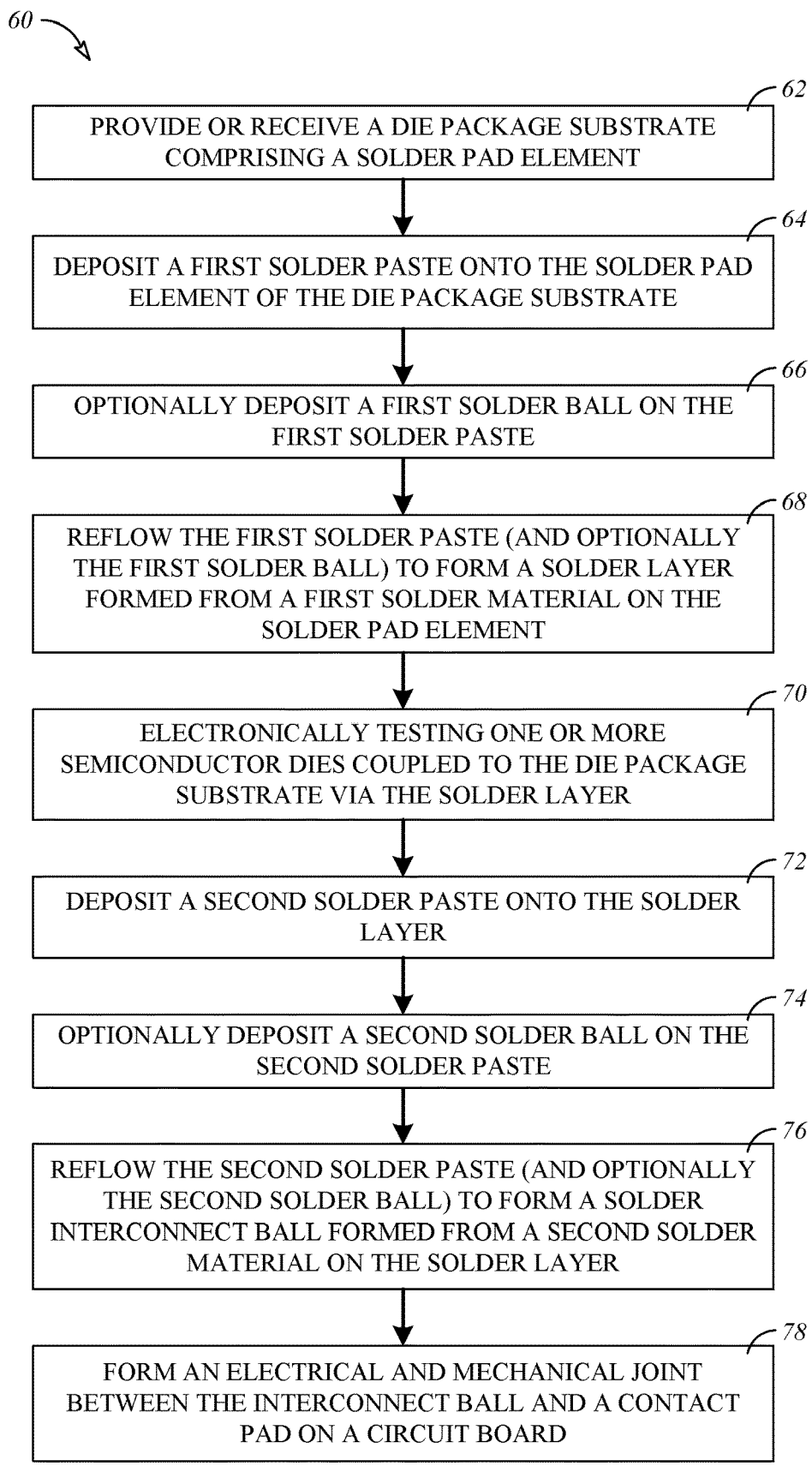
FIG. 5 is a flow diagram of another example method of manufacturing an example hybrid solder connection structure on an electronic die package, in accordance with some example embodiments.
Figure 6A:
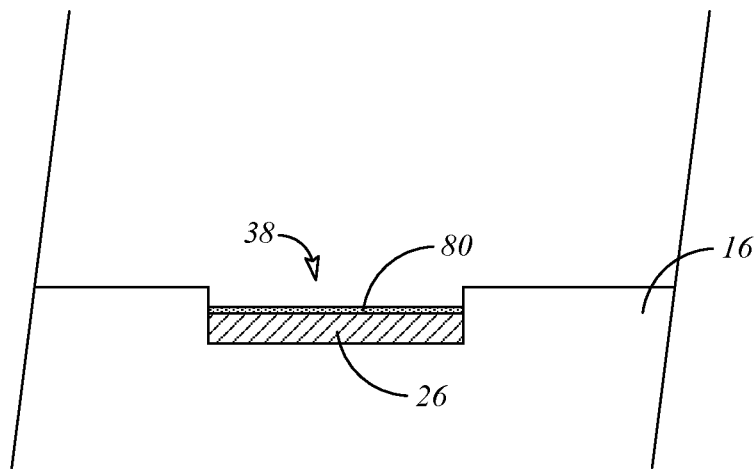
FIGS. 6A-6I are close-up side plan views of various steps of a method of forming an example hybrid solder connection on an electronic die package, in accordance with some example embodiments.

FIG. 5 is a flow diagram of another example method 60 of fabricating a hybrid solder joint, such as the hybrid solder joint 30 shown in FIGS. 1-3. FIGS. 6A-6I show a cross-sectional side view of the hybrid solder joint as it is formed by the example method 60 of FIG. 5. The method 60 is a more specific version of the method 50 described above with respect to FIG. 4. In an example, the method 60 includes, at step 62, providing or receiving a die package substrate comprising a solder pad element, such as the die package substrate 16 comprising the solder pads 26 described above with respect to FIG. 1. In an example, there are one or more semiconductor dies coupled to the die package substrate 16 in step 62, such as the semiconductor dies 18, 20 coupled to the substrate 16 shown in FIG. 1. FIG. 6A shows a close-up cross-sectional view of an example solder pad 26 on the substrate 16 that can be the result of step 62. As can be seen in the example of FIG. 6A, the substrate 16 can include a solder resist opening 38 into which the solder pad 26 has been deposited. In an example, the solder pad 26 can include a preservation surface finish 80, which can be coated on the solder pad 26 to minimize or prevent corrosion of the material that forms the solder pad 26. For example, if the solder pad 26 is made from copper, which is known to become easily oxidized during the manufacture of electronic devices, then the preservation surface finish 80 can prevent oxidation of the copper material that forms the solder pad 26.

Figure 6B:
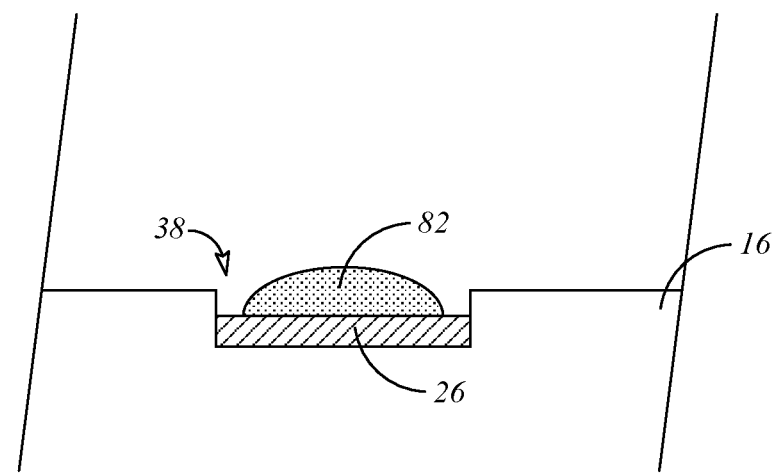

Next, the method 60 can include, at step 64, depositing a first solder paste or flux onto the solder pad 26 of the die package substrate 16. FIG. 6B shows an example of the result of step 64, with a small amount of a first solder paste or flux 82 applied onto the solder pad 26 on the substrate 16. As described above, in an example, the first solder paste 82 comprises particles of the metals that form a desired final composition for a first solder material that will form the solder layer 32, wherein the particles are dispersed in a flux material. In an example, the first solder paste or flux can include a water soluble paste or a no clean paste.

In an example wherein the solder pad 26 on the substrate 16 that is provided or received in step 62 includes a preservation surface finish 80, the method 60 can include removing the preservation surface finish 80 before depositing the first solder paste or flux 82 onto the solder pad 26 so that there will be an electrical connection between the solder layer 32 that will be formed from the first solder material that is included in the first solder paste 82. Therefore, in an example, depositing the first solder paste or flux 82 (step 64) results in the first solder paste or flux 82 being directly in contact with the solder pad 26, as shown in FIG. 6B.

As will be appreciated by those having skill in the art, the individual solder pad 26 shown in FIG. 6B is just one of a plurality of solder pads 26 that make up an array of connection points for electrical and mechanical connection to the substrate 16 (also referred to hereinafter as "the pad array"). In an example, depositing the first solder paste or flux 82 onto the solder pad 26 (step 64) can include depositing the first solder paste or flux 82 onto a plurality of solder pads 26 at the same or substantially the same time, e.g., so that the first solder paste or flux 82 is deposited onto the plurality of the solder pads 26 that make up the pad array, or at least to a portion of the solder pads 26 that make up the pad array.

In an example, depositing the first solder paste or flux 82 onto the plurality of the solder pads 26 (step 64) includes printing the first solder paste or flux 82 onto the plurality of solder pads 26 via any method known in the art for applying a solder paste or flux material onto an array of solder pads. For example, printing of the first solder paste or flux 82 can comprise dipping a plurality of pins into the first solder paste or flux 82 so that a specified amount of the first solder paste or flux 82 is positioned on each of the pins, wherein the plurality of pins are arranged in a pattern that substantially matches the pattern of the solder pads 26 in the pad array. The plurality of pins can then be moved to the location of the solder pads 26 and the first solder paste or flux 82 can be transferred from each of the plurality of pins to a corresponding one of the solder pads 26 in order to print the first solder paste or flux 82 from the pins onto the solder pads 26 of the pad array. In another example, a stencil can be used with a plurality of stencil openings arranged in a pattern that substantially matches the pattern of the solder pads 26 in the pad array. The stencil can be placed onto the substrate 16 so that each stencil opening is aligned with a corresponding solder pad 26. The first solder paste or flux 82 can then be spread into the stencil openings so that the first solder paste or flux 82 is printed onto each of the plurality of the solder pads 26 of the pad array. Those having skill in the art will appreciate that there may be other methods of printing or applying the first solder paste or flux 82 onto the plurality of the solder pads 26 of the pad array.

Figure 6C:
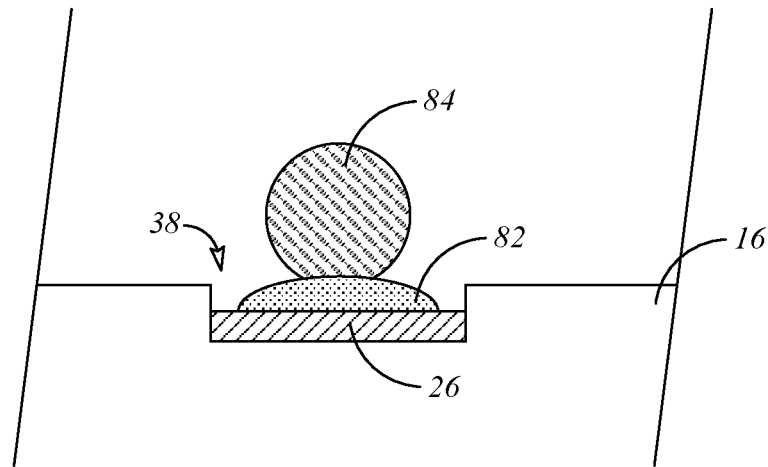

In an example, the method 60 can optionally include, at optional step 66, after depositing the first solder paste or flux 82, depositing a solder ball onto the first solder paste or flux 82. FIG. 6C shows an example of the result of step 66, with a small first solder ball 84 deposited onto the first solder paste or flux 82. As will be appreciated by those having skill in the art, the presence of the first solder paste or flux 82 can assist in the placement of the first solder ball 84 so that the first solder ball 84 is positioned as desired relative to the solder pad 26. As described above, in an example, the individual solder pad 26 shown in FIG. 6C is one of a plurality of solder pads 26 that make up a pad array. Therefore, similar to the step 64 of depositing the first solder paste or flux 82, step 66 can include depositing a plurality of the first solder balls 84 onto a plurality of dabs of the first solder paste or flux 82.

Figure 6D:
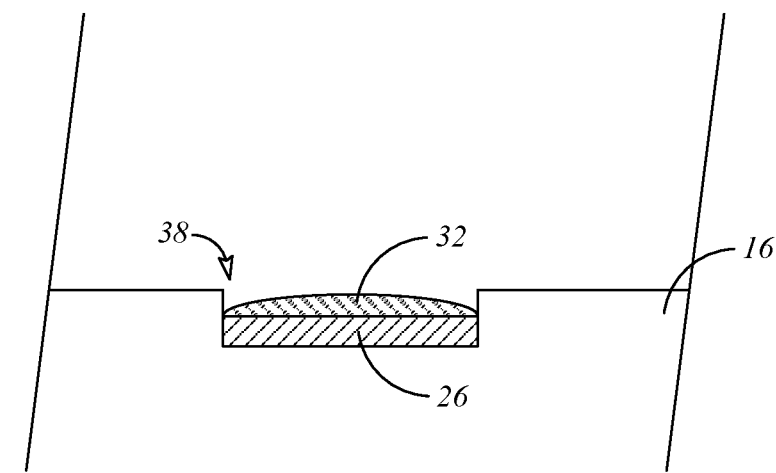

After the first solder paste or flux 82 has been deposited onto the solder pads 26 of the pad array (step 64) and, optionally in some examples, after depositing the first solder balls 84 onto the dabs of the first solder paste or flux 82 (optional step 66), the method 60 can include, at step 68, heating the first solder paste or flux 82 (and optionally the first solder ball 84) in order to reflow the metal particles in the first solder paste or flux 82 and/or optionally the metal of the first solder ball 84 into the metal first solder material that forms the solder layer 32 on the solder pad 26. In other words, step 68 melts the metal that is in the first solder paste or flux 82 and/or the first solder ball 84 so that the metal flows and forms the structure of the solder layer 32 on each of the solder pads 26. In an example, heating the first solder paste or flux 82 and optionally the first solder ball 84 (step 68) is performed at a temperature that is higher than the first melting temperature of the first solder material so that the metal in the first solder paste or flux 82 and/or optionally the first solder ball 84 will melt and form the solder layer 32. FIG. 6D shows an example of the result of step 68, with the first solder paste or flux 82 and/or the first solder ball 84 having been reflowed to form the relatively thin solder layer 32 on the solder pad 26. In an example, reflowing the first solder paste or flux 82 and/or the first solder ball 84 (step 68) results in a solder layer 32 that covers all or substantially all of the solder pad 26. Step 68 can also include removing the flux material that had been present in the first solder paste or flux 82, also referred to as "defluxing," so that the flux material is no longer present at the solder pad 26 and so that what remains is the metal of the first solder material, which forms the solder layer 32.

Figure 6E:
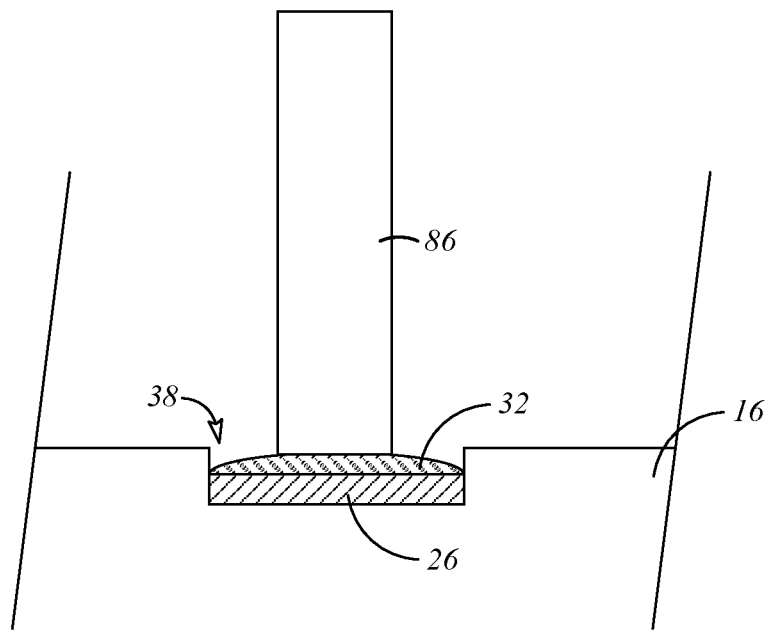

After the first solder paste or flux 82 and optionally the first solder ball 84 has been reflowed to form the first solder material of the solder layer 32 (step 68), the method 60 can include, at step 70, electronically testing one or more of the semiconductor dies coupled to the die package substrate 16 (e.g., one or more of the semiconductor dies 18, 20) via the solder layers 32 that have been deposited on the solder pads 26 of the pad array (also referred to hereinafter as "the solder array"). In an example, electronically testing the one or more semiconductor dies 18, 20 via the solder layers 32 of the solder array includes contacting each solder layer 32 with a testing probe 86, as shown in FIG. 6E, wherein the testing probe 86 passes a specified current of electricity through the solder layer 32 and the solder pad 26 so that the specified current will be passed to a specified one of the semiconductor dies 18, 20 which is electrically connected to the solder pad 26, such as through one or more internal vias or other structures within the substrate 16 (as discussed in more detail above). In an example, electronically testing the one or more semiconductor dies 18, 20 includes contacting each of a plurality of the solder layers 32 of the solder array at the same time or substantially the same time with a corresponding plurality of testing probes 86 in order to electrically test a plurality of electrical connections between the solder layers 32 and the one or more semiconductor dies 18, 20 coupled to the substrate 16.

In an example, the electrical testing of the one or more semiconductor dies 18, 20 includes multiple contacts of each the solder layers 32 with multiple testing probes 86, e.g., with dozens or even hundreds of contacts for each solder layer 32 at temperatures of more than 100° C. As discussed above, the relatively high first melting temperature of the first solder material (e.g., with a melting temperature of at least about 215° C., such as at least about 219° C., for example at least 240° C.) is such that the solder layers 32 of the solder array are able to withstand the electronic testing of step 70 substantially without flattening or "pancaking" of the solder layers 32 and substantially without burning of the electrical socket due to unbalanced force being applied by the testing probes 86, which can leave residue on the solder layer 32.

Figure 6F:
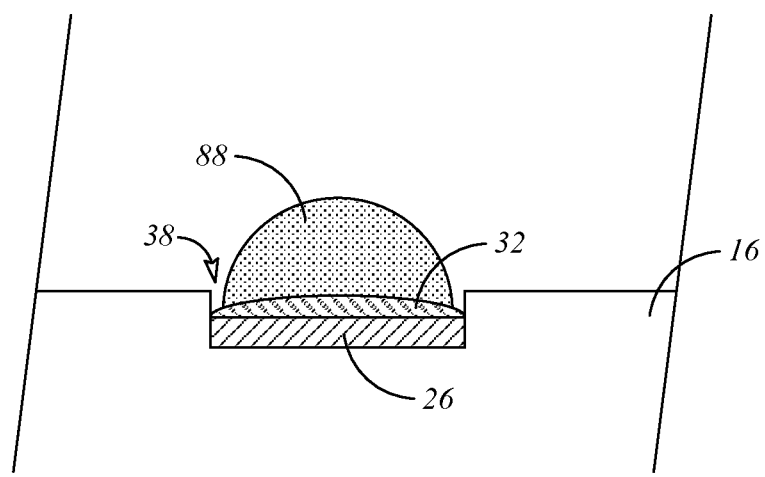

After electronically testing the one or more semiconductor dies 18, 20 (step 70), the method 60 can include, at step 72, depositing a second solder paste or flux onto the solder layer 32. FIG. 6F shows an example of the result of step 70, with a second solder paste or flux 88 applied onto the solder layer 32. As described above, in an example, the second solder paste 88 comprises particles of the metals that form a desired final composition for a second solder material that will form the interconnect ball 34, wherein the particles are dispersed in a flux material. In an example, the second solder paste or flux can include a water soluble paste or a no clean paste.

As described above, in an example, the individual solder pad 26 shown in FIG. 6F is one of a plurality of solder pads 26 that make up a pad array. Therefore, similar to the steps 64 and 66, step 72 can include depositing the second solder paste or flux 88 onto a plurality of the solder layers 32 of the solder array. Depositing the second solder paste or flux 88 onto the plurality of solder layers 32 of the solder array can be performed by any of the methods described above, e.g., printing of the second solder paste or flux 88 such as via pin printing or stencil printing.

Figure 6G:
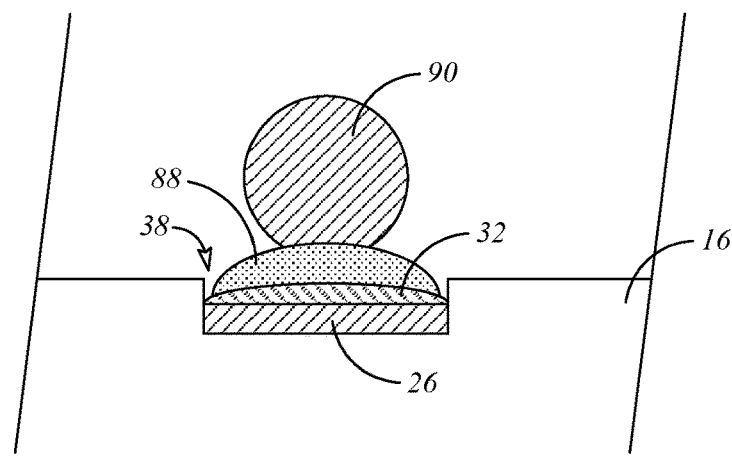

In an example, the method 60 can optionally include, at optional step 74, after depositing the second solder paste or flux 88, depositing a second solder ball onto the second solder paste or flux 88. FIG. 6G shows an example of the result of step 74, with a second solder ball 90 deposited onto the second solder paste or flux 88. As will be appreciated by those having skill in the art, the presence of the second solder paste or flux 88 can assist in the placement of the second solder ball 90 so that the second solder ball 90 is positioned as desired relative to the solder pad 26 and the solder layer 32. As described above, in an example, the individual solder pad 26 shown in FIG. 6G is one of a plurality of solder pads 26 that make up a pad array. Therefore, similar to the steps 62, 64, and 72, step 74 can include depositing a plurality of the second solder balls 88 onto a plurality of dabs of the second solder paste or flux 88.

Figure 6H:
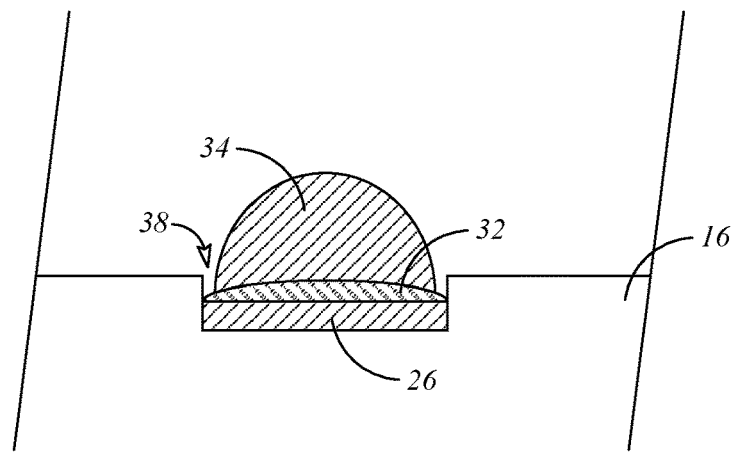

After depositing the second solder paste or flux 88 onto the solder layer 32 (step 72) and, optionally in some examples, after depositing the second solder balls 90 onto the dabs of the second solder paste or flux 88 (optional step 74), the method 60 can include, at step 76, heating the second solder paste or flux 88 (and optionally the second solder ball 90) in order to reflow the metal particles in the second solder paste or flux 88 and/or optionally the metal of the second solder ball 90 into the metal second solder material that forms the interconnect ball 34 on the solder layer 32. In other words, step 76 melts the metal that is in the second solder paste or flux 88 and/or the second solder ball 90 so that the metal flows and forms the structure of the interconnect ball 34 on each of the solder layers 32. In an example, heating the second solder paste or flux 88 and optionally the second solder ball 90 (step 76) is performed at a temperature that is lower than the first melting temperature of the first solder material but higher than the second melting temperature of the second solder material, e.g., so that the metal in the second solder paste or flux 88 and/or optionally the second solder ball 90 will melt in order to form the interconnect ball 34 but so that the first solder material of the solder layer 32 will not melt. FIG. 6H shows an example of the result of step 76, with the second solder paste or flux 88 and/or the second solder ball 90 having been reflowed to form the interconnect ball 34 on the solder layer 32. Step 76 can also include removing the flux material that had been present in the second solder paste or flux 88, e.g., "defluxing," so that the flux material that had been present in the second solder paste or flux 88 is no longer present at the solder pad 26 and so that what remains is the metal of the second solder material, which forms the interconnect ball 34.

Figure 6I:
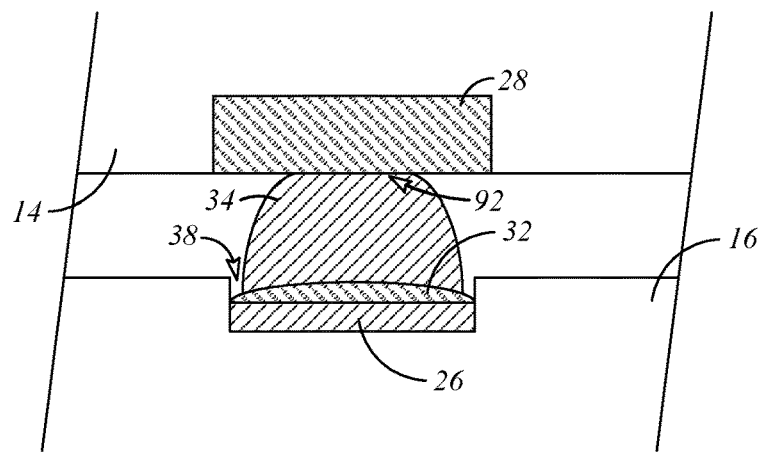

After the formation of the interconnect ball 34 on the solder layer 32, the structures that can form the hybrid solder joint 30 are completed. At this point, the electronic die package (e.g., the die package 12 in FIG. 1) is substantially completed and can be shipped to a manufacturer of the overall electronic device (e.g., the electronic device 10 in FIG. 1, also referred to as the "device manufacturer"). The device manufacturer can receive the die package 12, and can attach the die package 12 to a circuit board 14, such as a motherboard, by contacting the interconnect balls 34 with corresponding contact pads 28 on the circuit board 14 and heating the interconnect ball 34 so that the second solder material reflows sufficiently to form an electrical and mechanical joint between each interconnect ball 34 and a corresponding contact pad 28 on the circuit board 14, as in optional step 78 of the method 60. FIG. 6I shows an example of the result of step 78, wherein the interconnect ball 34 has been contacted with the contact pad 28 and has been reflowed in order to provide an electrical and mechanical joint 92 between the interconnect ball 34 and the contact pad 28. After formation of the electrical and mechanical joint 92 between the interconnect balls 34 of the ball grid array and the corresponding contact pads 28 of the contact pad array, the electronic device 10 is completed and ready for operation.

Figure 7:
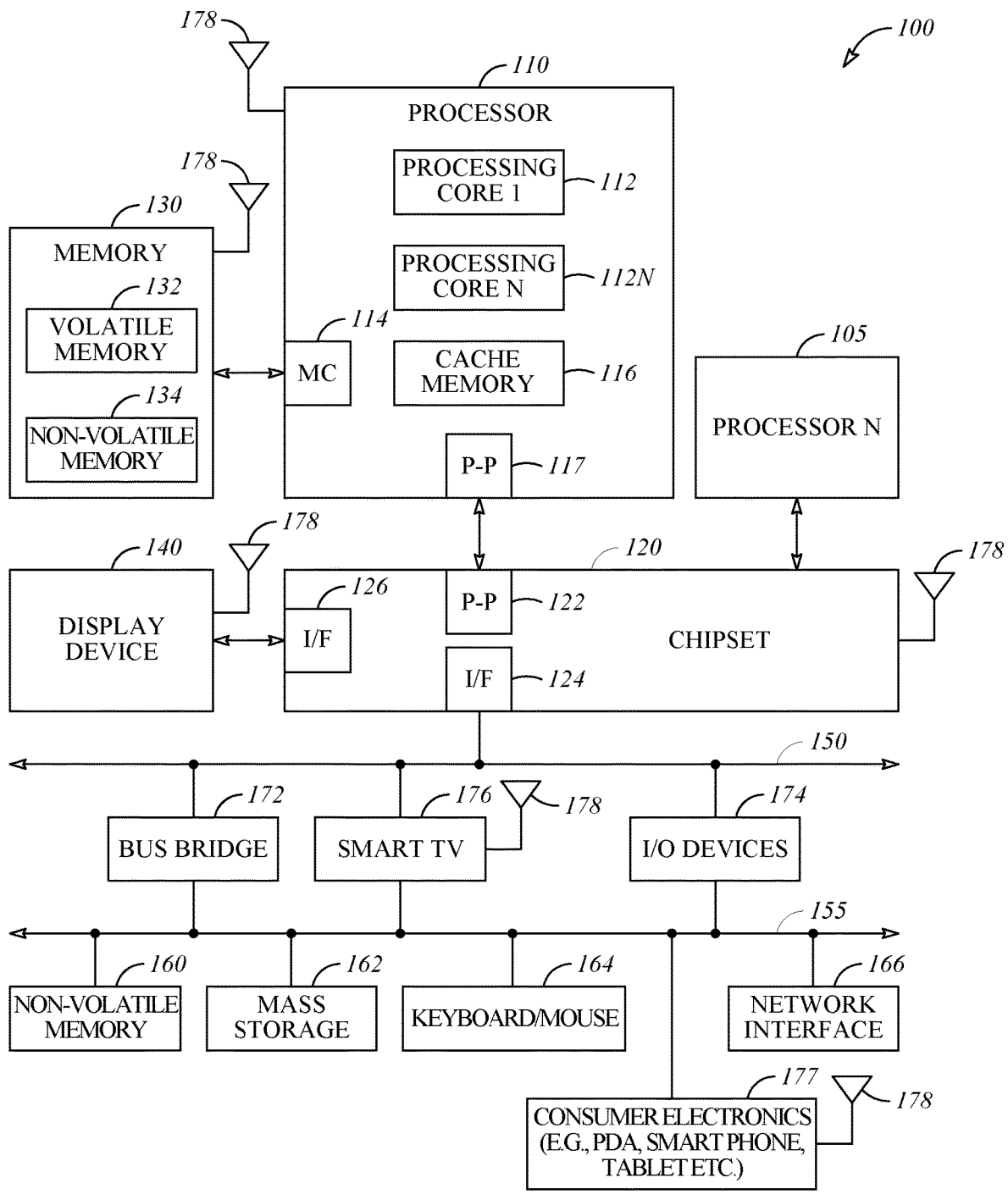
FIG. 7 is a system diagram depicting a system that may incorporate the example hybrid solder connection and methods, in accordance with some example embodiments.

FIG. 7 illustrates a system level diagram, depicting an example of an electronic device (e.g., system) that may include a hybrid solder joint and/or methods described above. In one embodiment, the system 100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 100 includes a system on a chip (SOC) system.

In one embodiment, processor 110 has one or more processor cores 112 and 112N, where 112N represents the Nth processor core inside processor 110 where N is a positive integer. In one embodiment, system 100 includes multiple processors including 110 and 105, where processor 105 has logic similar or identical to the logic of processor 110. In some embodiments, processing core 112 includes, but is not limited to, pre-fetch logic to fetch instructions, decode logic to decode the instructions, execution logic to execute instructions and the like. In some embodiments, processor 110 has a cache memory 116 to cache instructions and/or data for system 100. Cache memory 116 may be organized into a hierarchal structure including one or more levels of cache memory.

In some embodiments, processor 110 includes a memory controller 114, which is operable to perform functions that enable the processor 110 to access and communicate with memory 130 that includes a volatile memory 132 and/or a non-volatile memory 134. In some embodiments, processor 110 is coupled with memory 130 and chipset 120. Processor 110 may also be coupled to a wireless antenna 178 to communicate with any device configured to transmit and/or receive wireless signals. In one embodiment, an interface for wireless antenna 178 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 134 includes, but is not limited to, flash memory, phase change memory (PCM), read-only memory (ROM), electrically erasable programmable read-only memory (EEPROM), or any other type of non-volatile memory device.

Memory 130 stores information and instructions to be executed by processor 110. In one embodiment, memory 130 may also stores temporary variables or other intermediate information while processor 110 is executing instructions. In the illustrated embodiment, chipset 120 connects with processor 110 via Point-to-Point (PtP or P-P) interfaces 117 and 122. Chipset 120 enables processor 110 to connect to other elements in system 100. In some embodiments of the example system, interfaces 117 and 122 operate in accordance with a PtP communication protocol such as the Intel® QuickPath Interconnect (QPI) or the like. In other embodiments, a different interconnect may be used.

In some embodiments, chipset 120 is operable to communicate with processor 110, 105N, display device 140, and other devices, including a bus bridge 172, a smart TV 176, I/O devices 174, nonvolatile memory 160, a storage medium (such as one or more mass storage devices) 162, a keyboard/mouse 164, a network interface 166, and various forms of consumer electronics 177 (such as a PDA, smart phone, tablet etc.), etc. In one embodiment, chipset 120 couples with these devices through an interface 124. Chipset 120 may also be coupled to a wireless antenna 178 to communicate with any device configured to transmit and/or receive wireless signals. In one example, any combination of components in a chipset may be separated by a continuous flexible shield as described in the present disclosure.

Chipset 120 connects to display device 140 via interface 126. Display 140 may be, for example, a liquid crystal display (LCD), a light emitting diode (LED) array, an organic light emitting diode (OLED) array, or any other form of visual display device. In some embodiments of the example system, processor 110 and chipset 120 are merged into a single SOC. In addition, chipset 120 connects to one or more buses 150 and 155 that interconnect various system elements, such as I/O devices 174, nonvolatile memory 160, storage medium 162, a keyboard/mouse 164, and network interface 166. Buses 150 and 155 may be interconnected together via a bus bridge 172.

In one embodiment, mass storage device 162 includes, but is not limited to, a solid state drive, a hard disk drive, a universal serial bus flash memory drive, or any other form of computer data storage medium. In one embodiment, network interface 166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 7 are depicted as separate blocks within the system 100, the functions performed by some of these blocks may be integrated within a single semiconductor circuit or may be implemented using two or more separate integrated circuits. For example, although cache memory 116 is depicted as a separate block within processor 110, cache memory 116 (or selected aspects of 116) can be incorporated into processor core 112.

To better illustrate the methods and apparatuses disclosed herein, a non-limiting list of exemplary embodiments are provided here:

EMBODIMENT 1 can include subject matter (such as an apparatus, a device, a method, or one or more means for performing acts), such as can include a die package comprising a substrate comprising a solder pad element, a semiconductor die coupled to the substrate, a solder layer comprising a first solder material deposited on the solder pad element, the first solder material having a first melting temperature, and an interconnect ball comprising a second solder material deposited on the solder layer, the second solder material having a second melting temperature that is less than the first melting temperature.

EMBODIMENT 2 can include, or can optionally be combined with the subject matter of EMBODIMENT 1, to optionally include the first melting temperature being at least 200° C.

EMBODIMENT 3 can include, or can optionally be combined with the subject matter of any one or a combination of EMBODIMENT 1 and EMBODIMENT 2, to optionally include the second melting temperature being less than 200° C.

EMBODIMENT 4 can include, or can optionally be combined with the subject matter of one or any combination of EMBODIMENTS 1-3, to optionally include the solder layer having a thickness of 60 micrometers or less.

EMBODIMENT 5 can include, or can optionally be combined with the subject matter of one or any combination of EMBODIMENTS 1-4, to optionally include the substrate having a solder resist opening, wherein the solder pad element is located in the solder resist opening.

EMBODIMENT 6 can include, or can optionally be combined with the subject matter of EMBODIMENT 5, to optionally include the solder layer being located at least partially within the solder resist opening.

EMBODIMENT 7 can include, or can optionally be combined with the subject matter of EMBODIMENT 6, to optionally include the solder resist opening having a depth, wherein a thickness of the solder layer is less than or equal to the depth of the solder resist opening.

EMBODIMENT 8 can include, or can optionally be combined with the subject matter of one or any combination of EMBODIMENTS 1-7, to optionally include the first solder material comprising from about 0 wt. % to about 5 wt. % silver (Ag), from about 0.1 wt. % to about 1 wt. % copper (Cu), and the balance tin (Sn).

EMBODIMENT 9 can include, or can optionally be combined with the subject matter of one or any combination of EMBODIMENTS 1-8, to optionally include the second solder material comprising tin (Sn), silver (Ag), copper (Cu), and from about 0 wt. % to about 70 wt. % of a dopant element.

EMBODIMENT 10 can include, or can optionally be combined with the subject matter of EMBODIMENT 9, to optionally include the dopant element comprising at least one of bismuth (Bi), antimony (Sb), nickel (Ni), zinc (Zn), gallium (Ga), indium (In), palladium (Pd), and copper (Cu).

EMBODIMENT 11 can include, or can optionally be combined with the subject matter of EMBODIMENT 9, to optionally include the dopant element consisting of or consisting essentially of bismuth (Bi).

EMBODIMENT 12 can include, or can optionally be combined with the subject matter of one or any combination of EMBODIMENTS 1-11, to optionally include the semiconductor die being one of a memory device, a computer processing unit (CPU), a graphics processing unit (GPU), or a processor.

EMBODIMENT 13 can include, or can optionally be combined with the subject matter of one or any combination of EMBODIMENTS 1-12, to include subject matter (such as an apparatus, a device, a method, or one or more means for performing acts), such as can include an electronic device comprising a circuit board and a die package coupled to the circuit board with one or more interconnect structures, wherein the die package comprises a substrate comprising a solder pad element and a semiconductor die coupled to the substrate, and wherein each of the one or more interconnect structures comprises a solder layer comprising a first solder material deposited on the solder pad element, the first solder material having a first melting temperature, and an interconnect ball comprising a second solder material deposited on the solder layer and electrically connected to the circuit board, the second solder material having a second melting temperature that is less than the first melting temperature.

EMBODIMENT 14 can include, or can optionally be combined with the subject matter of EMBODIMENT 13, to optionally include the first melting temperature being at least 200° C.

EMBODIMENT 15 can include, or can optionally be combined with the subject matter of one or a combination of EMBODIMENT 13 and EMBODIMENT 14, to optionally include the second melting temperature being less than 200° C.

EMBODIMENT 16 can include, or can optionally be combined with the subject matter of one or any combination of EMBODIMENTS 13-15, to optionally include the solder layer having a thickness of 60 micrometers or less.

EMBODIMENT 17 can include, or can optionally be combined with the subject matter of one or any combination of EMBODIMENTS 13-16, to optionally include the substrate further comprising a solder resist opening, wherein the solder pad element is located in the solder resist opening.

EMBODIMENT 18 can include, or can optionally be combined with the subject matter of EMBODIMENT 17, to optionally include the solder layer being located at least partially in the solder resist opening.

EMBODIMENT 19 can include, or can optionally be combined with the subject matter of EMBODIMENT 18, to optionally include the solder resist opening having a depth, wherein a thickness of the solder layer is less than or equal to the depth of the solder resist opening.

EMBODIMENT 20 can include, or can optionally be combined with the subject matter of one or any combination of EMBODIMENTS 13-19, to optionally include the first solder material comprising from about 0 wt. % to about 5 wt. % silver (Ag), from about 0.1 wt. % to about 1 wt. % copper (Cu), and the balance tin (Sn).

EMBODIMENT 21 can include, or can optionally be combined with the subject matter of one or any combination of EMBODIMENTS 13-20, to optionally include the second solder material comprising tin (Sn), silver (Ag), copper (Cu), and from about 0 wt. % to about 70 wt. % of a dopant element.

EMBODIMENT 22 can include, or can optionally be combined with the subject matter of EMBODIMENT 21, to optionally include the dopant element comprising at least one of bismuth (Bi), antimony (Sb), nickel (Ni), zinc (Zn), gallium (Ga), indium (In), palladium (Pd), and copper (Cu).

EMBODIMENT 23 can include, or can optionally be combined with the subject matter of EMBODIMENT 21, to optionally include the dopant element consisting of or consisting essentially of bismuth (Bi).

EMBODIMENT 24 can include, or can optionally be combined with the subject matter of one or any combination of EMBODIMENTS 13-23, to optionally include the semiconductor die being one of a memory device, a computer processing unit (CPU), a graphics processing unit (GPU), or a processor.

EMBODIMENT 25 can include, or can optionally be combined with the subject matter of one or any combination of EMBODIMENTS 1-24, to include subject matter (such as an apparatus, a device, a method, or one or more means for performing acts), such as can include a method of manufacturing a die package, the method comprising depositing a first solder material onto a solder pad element of a die package substrate so that the first solder material forms a solder layer on the solder pad element, wherein the first solder material has a first melting temperature, and depositing a second solder material onto the solder layer so that the second solder material forms an interconnect ball on the solder layer, wherein the second solder material has a second melting temperature that is less than the first melting temperature.

EMBODIMENT 26 can include, or can optionally be combined with the subject matter of EMBODIMENT 25, to optionally include electronically testing a semiconductor die electrically coupled to the die package substrate via the solder layer before depositing the second solder material onto the solder layer.

EMBODIMENT 27 can include, or can optionally be combined with the subject matter of EMBODIMENT 26, to optionally include the semiconductor die being one of a memory device, a computer processing unit (CPU), a graphics processing unit (GPU), or a processor.

EMBODIMENT 28 can include, or can optionally be combined with the subject matter of one or any combination of EMBODIMENTS 25-27, to optionally include the depositing of the first solder material comprising depositing a first solder paste or flux onto the solder pad element and reflowing the first solder paste or flux to form the solder layer.

EMBODIMENT 29 can include, or can optionally be combined with the subject matter of EMBODIMENT 28, to optionally include the depositing of the first solder paste or flux comprising printing the first solder paste or flux onto the solder pad element.

EMBODIMENT 30 can include, or can optionally be combined with the subject matter of EMBODIMENT 29, to optionally include the printing of the first solder paste or flux comprising at least one of pin dipping the first solder paste or flux or stencil printing the first solder paste or flux.

EMBODIMENT 31 can include, or can optionally be combined with the subject matter of one or any combination of EMBODIMENTS 28-30, to optionally include the depositing of the first solder material further comprising depositing a first solder ball onto the first solder paste or flux, wherein the reflowing comprising reflowing the first solder paste or flux and the first solder ball to form the solder layer.

EMBODIMENT 32 can include, or can optionally be combined with the subject matter of one or any combination of EMBODIMENTS 25-31, to optionally include the depositing of the second solder material comprising depositing a second solder paste or flux onto the solder layer and reflowing the second solder paste or flux to form the interconnect ball at a temperature that is lower than a melting temperature of the first solder material.

EMBODIMENT 33 can include, or can optionally be combined with the subject matter of EMBODIMENT 32, to optionally include the depositing of the second solder paste or flux comprising printing the second solder paste onto the solder layer.

EMBODIMENT 34 can include, or can optionally be combined with the subject matter of EMBODIMENT 33, to optionally include the printing of the second solder paste or flux comprising at least one or pin dipping the second solder paste or flux or stencil printing the second solder paste or flux.

EMBODIMENT 35 can include, or can optionally be combined with the subject matter of one or any combination of EMBODIMENTS 32-34, to optionally include the depositing of the second solder material further comprising depositing a second solder ball onto the second solder paste or flux, wherein the reflowing comprising reflowing the second solder paste or flux and the second solder ball to form the interconnect ball.

EMBODIMENT 36 can include, or can optionally be combined with the subject matter of one or any combination of EMBODIMENTS 25-35, to optionally include the depositing of the first solder material onto the solder pad element including depositing the first solder material into a solder resist opening in the die package substrate.

EMBODIMENT 37 can include, or can optionally be combined with the subject matter of EMBODIMENT 36, to optionally include the depositing of the first solder material into the solder resist opening being such that at least a portion of the solder layer is within the solder resist opening.

EMBODIMENT 38 can include, or can optionally be combined with the subject matter of EMBODIMENT 37, to optionally include the depositing of the first solder material into the solder resist opening being such that a thickness of the solder layer is less than or equal to a depth of the solder resist opening.

EMBODIMENT 39 can include, or can optionally be combined with the subject matter of one or any combination of EMBODIMENTS 25-38, to optionally include the first melting temperature being at least 200° C.

EMBODIMENT 40 can include, or can optionally be combined with the subject matter of one or any combination of EMBODIMENTS 25-39, to optionally include the second melting temperature being less than 200° C.

EMBODIMENT 41 can include, or can optionally be combined with the subject matter of one or any combination of EMBODIMENTS 25-40, to optionally include the solder layer having a thickness of 60 micrometers or less.

EMBODIMENT 42 can include, or can optionally be combined with the subject matter of one or any combination of EMBODIMENTS 25-41, to optionally include the first solder material comprising from about 0 wt. % to about 5 wt. % silver (Ag), from about 0.1 wt. % to about 1 wt. % copper (Cu), and the balance tin (Sn).

EMBODIMENT 43 can include, or can optionally be combined with the subject matter of one or any combination of EMBODIMENTS 25-42, to optionally include the second solder material comprising tin (Sn), silver (Ag), copper (Cu), and from about 0 wt. % to about 70 wt. % of a dopant element.

EMBODIMENT 44 can include, or can optionally be combined with the subject matter of EMBODIMENT 43, to optionally include the dopant element comprising at least one of bismuth (Bi), antimony (Sb), nickel (Ni), zinc (Zn), gallium (Ga), indium (In), palladium (Pd), and copper (Cu).

EMBODIMENT 45 can include, or can optionally be combined with the subject matter of EMBODIMENT 44, to optionally include the dopant element consisting of or consisting essentially of bismuth (Bi).

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A die package comprising:
a substrate comprising a solder pad element;
a semiconductor die coupled to the substrate;
a solder layer comprising a first solder material on the solder pad element, the first solder material comprising tin (Sn), silver (Ag) and copper (Cu); and
an interconnect ball comprising a second solder material in contact with the first solder material, wherein the second solder material comprises more bismuth (Bi) or indium (In) than the first solder material, and less Sn than the first solder material.

2. The die package of claim 1, wherein the first solder material has a melting temperature of at least 200° C.

3. The die package of claim 2, wherein the second solder material has a melting temperature of less than 200° C.

4. The die package of claim 1, wherein the solder layer has a thickness of less than 60 micrometers.

5. The die package of claim 1, wherein the substrate further comprises a solder resist opening, wherein the solder pad element is located within the solder resist opening and wherein the solder layer is located at least partially within the solder resist opening.

6. The die package of claim 1, wherein the first solder material comprises up to 5 wt. % silver (Ag), from 0.1 wt. % to 1 wt. % copper (Cu), and the balance tin (Sn).

7. The die package of claim 1, wherein the second solder material comprises at least 30 wt. % Bi or at least 20 wt. % In, and wherein the first solder material has less than 5 wt. % Bi.

8. The die package of claim 7, wherein the first solder material comprises at least 90 wt. % Sn, and wherein the second solder material comprises less than 80 wt. % Sn.

9. The die package of claim 1, wherein the semiconductor die is one of a memory device, a computer processing unit (CPU), a graphics processing unit (GPU), or a processor.

10. An electronic device comprising:
a circuit board; and
a die package coupled to the circuit board with one or more interconnect structures,
wherein the die package comprises a substrate comprising a solder pad element and a semiconductor die coupled to the substrate, and
wherein each of the one or more interconnect structures comprises:
 a solder layer comprising a first solder material of primarily Sn on the solder pad element, the first solder material having a first melting temperature; and
 an interconnect ball comprising a second solder material deposited on the solder layer and electrically connected to the circuit board, the second solder material having a second melting temperature that is less than the first melting temperature and comprising more bismuth (Bi) or indium (In) than the first solder material, and less Sn than the first solder material.

11. The electronic device of claim 10, wherein the solder layer has a thickness of less than 60 micrometers.

12. The electronic device of claim 10, wherein the substrate further comprises a solder resist opening, wherein the solder pad element is formed in the solder resist opening.

13. The electronic device of claim 10, wherein the first solder material comprises up to 5 wt. % silver (Ag), from 0.1 wt. % to 1 wt. % copper (Cu), and the balance tin (Sn).

14. The electronic device of claim 10, wherein the second solder material comprises at least 30 wt. % Bi or at least 20 wt. % In, and wherein the first solder material has less than 5 wt. % Bi.

15. The electronic device of claim 14, wherein the first solder material comprises at least 90 wt. % Sn, and wherein the second solder material comprises less than 80 wt. % Sn.

16. A method of manufacturing a die package, the method comprising:
 depositing a first solder material onto a solder pad element of a die package substrate so that the first solder material forms a solder layer on the solder pad element, wherein the first solder material has a first melting temperature;
 landing an electrical testing probe on the first solder material; and
 depositing a second solder material onto the solder layer so that the second solder material forms an interconnect ball on the solder layer, wherein the second solder material has a second melting temperature that is less than the first melting temperature.

17. The method of claim 16, further comprising electronically testing a semiconductor die electrically coupled to the die package substrate via the probe in contact with the solder layer before depositing the second solder material onto the solder layer.

18. The method of claim 16, wherein depositing the first solder material comprises depositing a first solder paste or flux onto the solder pad element and reflowing the first solder paste or flux to form a tin (Sn), silver (Ag) and copper (Cu) alloy as the solder layer.

19. The method of claim 18, wherein depositing the first solder paste or flux comprises printing the first solder paste onto the solder pad element.

20. The method of claim 19, wherein printing the first solder paste or flux comprises at least one of pin dipping the first solder paste or flux or stencil printing the first solder paste or flux.

21. The method of claim 18, wherein depositing the first solder material further comprises depositing a first solder ball on the first solder paste or flux, wherein the reflowing comprises reflowing the first solder paste or flux and the first solder ball to form the solder layer.

22. The method of claim 16, wherein depositing the second solder material comprises depositing a second solder paste or flux onto the solder layer and reflowing the second solder paste or flux at a temperature that is lower than a melting temperature of the first solder material to form the interconnect ball from an alloy comprising more bismuth (Bi) or indium (In) than the first solder material, and less Sn than the first solder material.

23. The method of claim 22, wherein depositing the second solder material further comprises depositing a second solder ball on the second solder paste or flux, wherein the reflowing comprises reflowing the second solder paste or flux and the second solder ball to form the interconnect ball.

24. The method of claim 16, wherein depositing the first solder material onto the solder pad element includes depositing the first solder material into a solder resist opening in the die package substrate.

* * * * *